US008476864B2

(12) United States Patent
Ferre Fabregas et al.

(10) Patent No.: US 8,476,864 B2
(45) Date of Patent: Jul. 2, 2013

(54) BATTERY MONITORING SYSTEM

(75) Inventors: Antoni Ferre Fabregas, Valls (ES); Jose Gabriel Fernandez Bañares, Valls (ES)

(73) Assignee: Lear Corporation, Southfield, MI (US)

( * ) Notice: Subject to any disclaimer, the term of this patent is extended or adjusted under 35 U.S.C. 154(b) by 1388 days.

(21) Appl. No.: 11/762,424

(22) Filed: Jun. 13, 2007

(65) Prior Publication Data

US 2008/0309469 A1 Dec. 18, 2008

(51) Int. Cl.
*H02J 7/14* (2006.01)

(52) U.S. Cl.
USPC .................... 320/104; 320/136; 320/152

(58) Field of Classification Search
USPC .................. 320/104, 111, 136, 152; 340/438
See application file for complete search history.

(56) References Cited

U.S. PATENT DOCUMENTS

| 4,470,654 | A | | 9/1984 | Friedman |
|---|---|---|---|---|
| 4,558,903 | A | | 12/1985 | Takagi |
| 4,572,878 | A | | 2/1986 | Daugherty |
| 4,640,549 | A | | 2/1987 | Yokota |
| 4,675,255 | A | | 6/1987 | Pfeifer et al. |
| 5,179,340 | A | | 1/1993 | Rogers |
| 5,206,775 | A | * | 4/1993 | Wilson .............. 361/15 |
| 5,218,288 | A | | 6/1993 | Mickal et al. |
| 5,590,933 | A | | 1/1997 | Andersson |
| 5,606,242 | A | | 2/1997 | Hull et al. |
| 5,629,680 | A | | 5/1997 | Makhija |
| 5,645,448 | A | | 7/1997 | Hill |
| 5,810,444 | A | | 9/1998 | Refior et al. |
| 5,877,563 | A | | 3/1999 | Krappel et al. |
| 5,903,154 | A | | 5/1999 | Zhang et al. |
| 5,939,855 | A | | 8/1999 | Proctor et al. |
| 5,939,861 | A | | 8/1999 | Joko et al. |
| 6,001,506 | A | | 12/1999 | Timmons et al. |
| 6,034,521 | A | | 3/2000 | Eckardt |
| 6,112,370 | A | | 9/2000 | Blanchard et al. |
| 6,149,235 | A | | 11/2000 | Fahim |
| 6,209,955 | B1 | | 4/2001 | Seibold |
| 6,218,805 | B1 | * | 4/2001 | Melcher .............. 320/105 |

(Continued)

FOREIGN PATENT DOCUMENTS

| DE | 2142860 | 3/1973 |
|---|---|---|
| DE | 2142860 A1 | 3/1973 |

(Continued)

OTHER PUBLICATIONS

German Office Action for Application No. 10 2008 022 787.0, mailed Mar. 21, 2010, 5 pages.

(Continued)

*Primary Examiner* — Edward Tso
*Assistant Examiner* — Aaron Piggush
(74) *Attorney, Agent, or Firm* — Brooks Kushman P.C.

(57) ABSTRACT

A battery monitor for monitoring operations of a battery, such as but not limited to monitoring operations of a vehicle battery. The battery monitor may be configured to monitor current flow and battery temperature. The battery monitor may be connected to a cable used to electrically connect the battery to a number of electronic devices so that the battery monitor is located away from the battery. The battery monitor may include a processing element grounded directly to a negative pole of the battery to facilitate isolating the processing element from noise created by the electronic devices connected to the cable.

19 Claims, 4 Drawing Sheets

U.S. PATENT DOCUMENTS

| | | |
|---|---|---|
| 6,285,191 B1 | 9/2001 | Gollomp et al. |
| 6,304,062 B1 | 10/2001 | Batson |
| 6,551,147 B2 | 4/2003 | Wakata et al. |
| 6,573,723 B2 | 6/2003 | Baston |
| 6,628,102 B2 | 9/2003 | Batson |
| 6,787,935 B2 | 9/2004 | Heim |
| 6,876,176 B2 | 4/2005 | Stefanovic et al. |
| 6,901,350 B2 | 5/2005 | Loehr et al. |
| 6,910,739 B2 | 6/2005 | Grable et al. |
| 6,918,800 B2 | 7/2005 | Ota et al. |
| 6,943,455 B1 | 9/2005 | Maxwell |
| 7,039,533 B2 | 5/2006 | Bertness et al. |
| 7,081,755 B2 | 7/2006 | Klang et al. |
| 7,152,922 B2 | 12/2006 | Garland |
| 7,164,272 B1 | 1/2007 | Borrego Bel et al. |
| 7,170,295 B2 | 1/2007 | Hetzler |
| 7,364,237 B2 | 4/2008 | Grable et al. |
| 7,367,624 B2 | 5/2008 | Garland |
| 7,380,885 B2 | 6/2008 | Fischer et al. |
| 7,381,101 B2 | 6/2008 | Roset et al. |
| 7,405,570 B2 | 7/2008 | Hirthammer |
| 7,425,038 B2 | 9/2008 | Deptolla |
| 7,500,888 B2 * | 3/2009 | Roset et al. ............... 439/754 |
| 7,630,181 B2 * | 12/2009 | Wilk et al. ............... 361/42 |
| 2001/0023037 A1 | 9/2001 | Kieninger et al. |
| 2001/0033171 A1 | 10/2001 | Batson |
| 2002/0011959 A1 | 1/2002 | Liu |
| 2002/0024334 A1 | 2/2002 | Dames |
| 2002/0180405 A1 | 12/2002 | Batson |
| 2002/0182493 A1 | 12/2002 | Ovshinsky et al. |
| 2003/0038637 A1 | 2/2003 | Bertness et al. |
| 2003/0054700 A1 | 3/2003 | Korte et al. |
| 2003/0057770 A1 | 3/2003 | Heim |
| 2003/0080601 A1 | 5/2003 | Charras et al. |
| 2003/0080835 A1 | 5/2003 | Hreish et al. |
| 2003/0141844 A1 | 7/2003 | Fiebig et al. |
| 2003/0203681 A1 | 10/2003 | Liang |
| 2003/0232546 A1 | 12/2003 | Davis |
| 2003/0236033 A1 | 12/2003 | Freitag |
| 2004/0048142 A1 | 3/2004 | Marusak et al. |
| 2004/0056634 A1 | 3/2004 | Seils et al. |
| 2004/0087219 A1 | 5/2004 | Freitag |
| 2004/0232918 A1 | 11/2004 | Bertness et al. |
| 2005/0014408 A1 | 1/2005 | Swiatek et al. |
| 2005/0035737 A1 | 2/2005 | Elder et al. |
| 2005/0057865 A1 * | 3/2005 | Veloo et al. ............... 361/56 |
| 2005/0058892 A1 | 3/2005 | Ovshinsky et al. |
| 2005/0101197 A1 | 5/2005 | Wirth |
| 2005/0175385 A1 | 8/2005 | Cho et al. |
| 2005/0190519 A1 | 9/2005 | Brown et al. |
| 2005/0202731 A1 | 9/2005 | Brito |
| 2005/0264296 A1 | 12/2005 | Philbrook |
| 2006/0003627 A1 | 1/2006 | Freitag |
| 2006/0057899 A1 | 3/2006 | Tokunaga |
| 2006/0076466 A1 | 4/2006 | Serra |
| 2006/0170529 A1 | 8/2006 | Shoji |
| 2006/0238951 A1 | 10/2006 | Cetiner et al. |
| 2007/0074905 A1 | 4/2007 | Lin et al. |
| 2008/0238431 A1 | 10/2008 | Schimmel |
| 2008/0252129 A1 | 10/2008 | Nathan et al. |
| 2009/0195252 A1 | 8/2009 | Kerbel |
| 2009/0212779 A1 | 8/2009 | Wenger |
| 2009/0224768 A1 | 9/2009 | Dollansky et al. |

FOREIGN PATENT DOCUMENTS

| | | |
|---|---|---|
| DE | 2842817 B1 | 5/1979 |
| DE | 3532044 A1 | 3/1987 |
| DE | 4429633 A1 | 2/1996 |
| DE | 19517709 C1 | 11/1996 |
| DE | 19924654 A1 | 12/2000 |
| DE | 19961311 A1 | 7/2001 |
| DE | 10031243 A1 | 1/2002 |
| DE | 10039472 A1 | 2/2002 |
| DE | 10118027 A1 | 11/2002 |
| DE | 10118051 A1 | 11/2002 |
| DE | 10116925 C1 | 1/2003 |
| DE | 10203512 A1 | 8/2003 |
| DE | 10332410 B3 | 5/2004 |
| DE | 20320473 U1 | 10/2004 |
| DE | 10333035 A1 | 2/2005 |
| DE | 10343179 A1 | 4/2005 |
| DE | 10347111 A1 | 5/2005 |
| DE | 10352266 A1 | 6/2005 |
| DE | 10354080 A1 | 6/2005 |
| DE | 102004004172 A1 | 8/2005 |
| DE | 102004007851 A1 | 9/2005 |
| DE | 102004013817 A1 | 10/2005 |
| DE | 102004025179 A1 | 12/2005 |
| DE | 102004046855 B3 | 4/2006 |
| DE | 102004049153 A1 | 4/2006 |
| DE | 102004049251 A1 | 4/2006 |
| DE | 102004051489 A1 | 5/2006 |
| DE | 102004053647 A1 | 5/2006 |
| DE | 102004053648 A1 | 5/2006 |
| DE | 102004053650 A1 | 5/2006 |
| DE | 102004055848 A1 | 5/2006 |
| DE | 202006001353 U1 | 5/2006 |
| DE | 102004055847 A1 | 6/2006 |
| DE | 102004055849 A1 | 6/2006 |
| DE | 102005003577 A1 | 8/2006 |
| DE | 202005013773 U1 | 8/2006 |
| DE | 102005041881 A1 | 9/2006 |
| DE | 102005041392 A1 | 10/2006 |
| DE | 102005019569 A1 | 11/2006 |
| DE | 102005019922 A1 | 11/2006 |
| DE | 102005021959 A1 | 11/2006 |
| DE | 102005032227 A1 | 1/2007 |
| DE | 10200502201 A1 | 5/2007 |
| EP | 0560468 A1 | 2/1993 |
| EP | 0725412 A2 | 8/1996 |
| EP | 0743736 A1 | 11/1996 |
| EP | 0438537 B1 | 12/1996 |
| EP | 1411364 A1 | 4/2004 |
| EP | 1238288 B1 | 7/2004 |
| EP | 1435424 A1 | 7/2004 |
| EP | 1621892 A1 | 2/2006 |
| EP | 1632781 A1 | 3/2006 |
| EP | 1632782 A1 | 3/2006 |
| EP | 0448745 A1 | 3/2007 |
| EP | 1828786 B1 | 7/2009 |
| FR | 2826744 A1 | 6/2002 |
| FR | 2879751 A1 | 6/2006 |
| GB | 1355142 A | 6/1974 |
| GB | 2388975 A | 11/2003 |
| WO | 9114600 A1 | 10/1991 |
| WO | 9633078 A1 | 10/1996 |
| WO | 9954744 A1 | 10/1999 |
| WO | 0131718 A2 | 5/2001 |
| WO | 0214887 A1 | 2/2002 |
| WO | 02082617 A1 | 10/2002 |

OTHER PUBLICATIONS

German Patent & Trademark Office, German Office Action for corresponding Application No. 10 2008 049 053.9, mailed Feb. 9, 2010, 3 pages.

* cited by examiner

BATTERY MONITORING SYSTEM

BACKGROUND OF THE INVENTION

1. Field of the Invention

The present invention relates to battery monitoring systems, such as but not limited to the type having capabilities for sensing and/or reporting battery operating conditions.

2. Background Art

Hybrid and non-hybrid vehicles may be equipped with energy storage devices, such as batteries for powering the vehicle and other devices located thereon. A battery monitor may be connected to a battery post and configured to sense battery operating conditions. These type of connectors may be employed in automotive vehicles having lead-acid or some other type of battery or similar energy storage device. The battery monitor may be advantageous in reporting the battery operating conditions to a junction box or other vehicle system controller.

The direct mounting of the battery monitor to the battery post can be problematic. The engine compartment and area around the battery may impose limitations on the amount of area the battery monitor can consume. This can make it difficult assembly and design the battery monitor to fit within a relatively small area, especially if the battery monitor is to be used across multiple vehicle platforms that may have differently sized batteries or other packaging issues. The direct mounting can also be problematic if it must to be disconnected or otherwise 'touched' when servicing the battery.

Automotive vehicles typically rely on the battery to power a number of electronic devices within the vehicle. The battery and electronic devices may be connected to a common vehicle ground. The switching on and off of the electronic devices, their natural operation, and other aspects of their function can induce noise and other interferences to the vehicle ground and devices connected thereto. This noise can make it difficult for the battery monitor to monitor the battery operating conditions.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
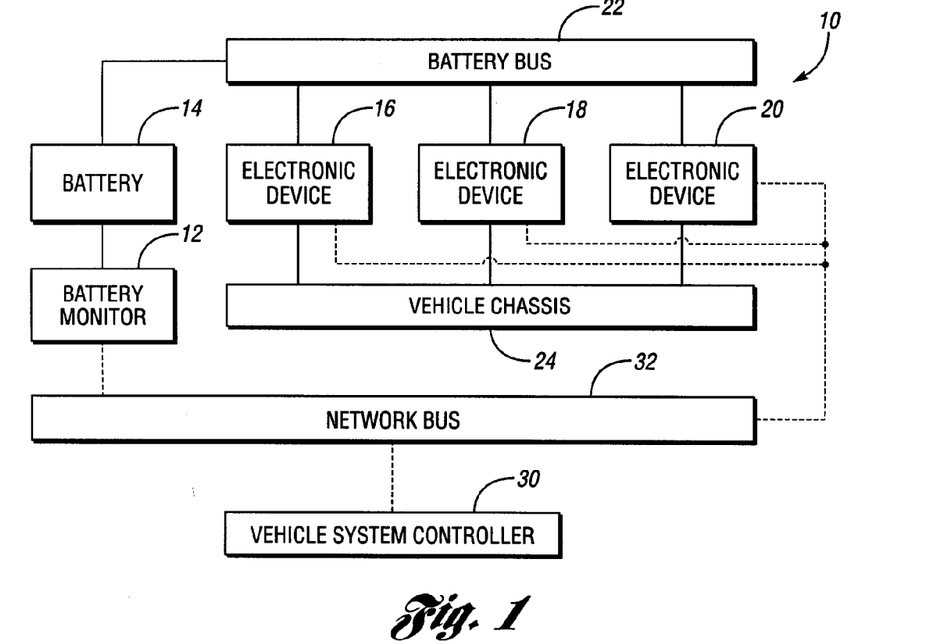
FIG. 1 schematically illustrates a battery monitoring system in accordance with one non-limiting aspect of the present invention.

FIG. 1 schematically illustrates a battery monitoring system 10 in accordance with one non-limiting aspect of the present invention. The system 10 may include a battery monitor 12 for monitoring operating conditions of a battery 14, such as but not limited to a lead-acid or other battery commonly employed within vehicles. The battery 14 may be used to power a number of electronic devices 16-20 in a vehicle (not shown). The electronic devices 16-20 may relate to any number of devices commonly employed to facilitate various vehicle operations, such as but not limited to lighting, entertainment, cooling, and other vehicles systems. A battery bus 22 (wire harness) may be included to facilitate powering the electronic devices.

The electronic devices 16-20 and the battery 14 may be connected to a common vehicle ground by way of a vehicle chassis 24. A vehicle system controller (VSC) 30 may communicate with the electronic devices 16-20 through signals carried over a network bus 32. The VSC 30 may be configured to control operations of the electronic devices 16-20 and to perform any number of other operations associated with any number of vehicle related controls. The battery monitor 12 may be configured or otherwise programmed to support any number of battery monitoring operations, such as but not limited to measuring/sensing current, voltage, and temperature. This information may be communicated over the network bus 32 to the VSC 30 for use in controlling vehicle operations.

Figure 2:
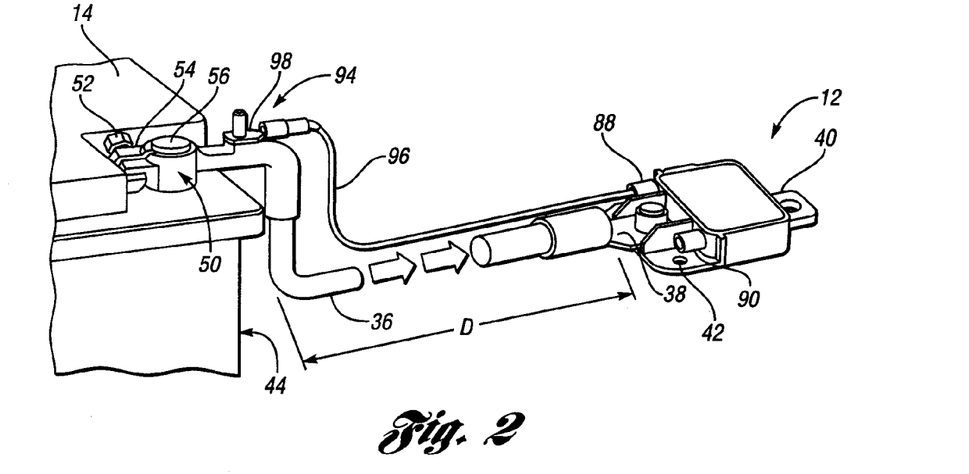
FIG. 2 illustrates the battery monitor in accordance with one non-limiting aspect of the present invention.

FIG. 2 illustrates the battery monitor 12 in accordance with one non-limiting aspect of the present invention. The battery monitor 12 may be connected to a cable 36 used to electrically connect the battery 14 to the vehicle chassis 24. The battery monitor 12 may be connected to an end of the cable 36 located at a distance D along the cable extending beyond the battery 12. A bracket 38 may be welded to one end of the cable 36 and threadably fastened to a shunt 40 of the battery monitor 12. The battery monitor 12 may include an opening 42 to facilitate fastening to another vehicle element (not shown) located away from an outside body 44 of the battery 14.

A terminal adapter 50 may be connected to an other end of the cable 36 opposite to the battery monitor 12. The terminal adapter 50 may comprise a tinned brass, stamped material, or other material suitable for conducting electricity from the battery. The terminal adapter 50 may include a screw 52 and clamp 54 for compressively applying force against a battery post 56 used to establish an electrical connection with the cable 12. The terminal adapter 50 is shown to be configured for attachment to a cylindrical or cone-shaped battery post 56 for exemplary purposes and without intending to limit the scope and contemplation of the present invention. Any type of connection to the battery 14 may be used. The terminal adapter 50 may be configured in an L-shape to extend away from and down a side 44 of the battery for connection to the cable 36.

The mounting of the battery monitor 12 to the cable 36 and at the distance D away from the battery 14 can be beneficial in that it allows the battery monitor 12 to be positioned in other areas of the engine compartment that may have less restrictions on packaging. This may also allow the battery 14 to be serviced without requiring the battery monitor 12 to be disconnected or otherwise 'touched' since the battery 14 can be serviced by simply disconnecting the terminal adapter 50. The battery monitor 12 and the vehicle chassis 24 have a slightly greater voltage 'ground' reference than the battery post 56 due to being connected to the cable 36 instead of directly to the negative battery post 56. The negative battery post 56 may be considered to be a 'real' or 'absolute' zero voltage reference for the vehicle with the battery monitor 12 and vehicle chassis 24 having a greater than zero voltage (milivolts to volts).

Figure 3:
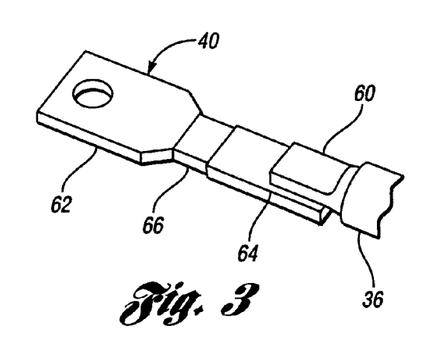
FIGS. 3-8 illustrates assembly of the battery monitor in accordance with one non-limiting aspect of the present invention.

FIGS. 3-8 illustrates the battery monitor 12 in accordance with one non-limiting aspect of the present invention. FIG. 3 illustrates the shunt 40 attaching to an electrically conducting portion 60 of the cable 36. The shunt 40 may be composed of any material have properties sufficient to facilitate electrical connectivity between the cable 36 he vehicle chassis 24. The shunt 40 is shown to be a bimetallic object having copper alloy portions 62-64 and a resistive copper alloy portion 66, such as but not limited to manganin. The copper portions 62-64 may correspond with the ends of the shunt 40 and the resistive copper alloy portion 66 may be arranged therebetween such that current must flow through one copper portion 62, through the resistive copper alloy portion 66, and finally through the other copper portion 64.

Figure 4:
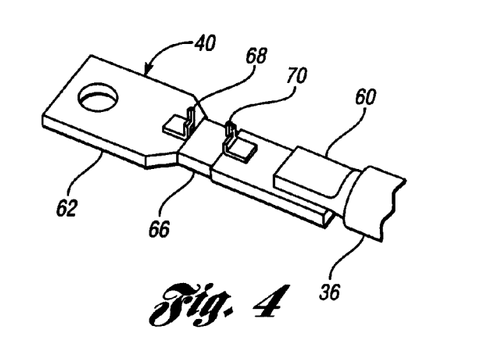

The resistive copper alloy portion 66 may be used as a measuring element suitable for conducting high currents. Connecting pins 68-70 may be included on either side of the copper alloy portion 66 for electrical connection with a processing element (not shown) included on a PCB 72. The processing element may be configured for monitoring a voltage drop between the connecting pins 68-70. The known resistive characteristics of the resistor copper alloy 66 may be used in conjunction with the voltage drop to determine current flow through the shunt 40. The known resistivity of the resistor copper alloy portion 66 can be helpful in assuring the accuracy and consistency of the current calculations. Of course, the present is not intended to be limited to the shunt 40 having the resistive copper alloy portion 66 and fully contemplates the use of any number of other suitable materials, including making the shunt out of a single material/composition, i.e., without the bimetallic composition.

The connection tabs 68-70 may be welded or otherwise electrically secured to the shunt. They may include footprints extending over a portion of the copper portions 62-64 of the shunt to facilitate measuring the voltage drop across the manganin portion 66. The connection tabs 68-70 are shown with a s-shaped portion having a shoulder to facilitate offsetting items place over top of the tabs and to ameliorate strain produced by the thermal and vibratory stress. Other connecting pins 68-70 may be used, such as but not limited to compliant pins or soldered wires (flexible or rigid), and other connection methods may be used in place of the pins 686-70, such as but not limited soldering the PCB directly to the shunt, pressing electrical conductors on the PCB 72 against the shunt, etc.

Figure 5:
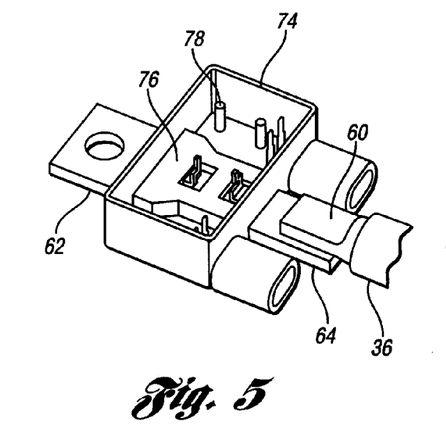
Figure 6:
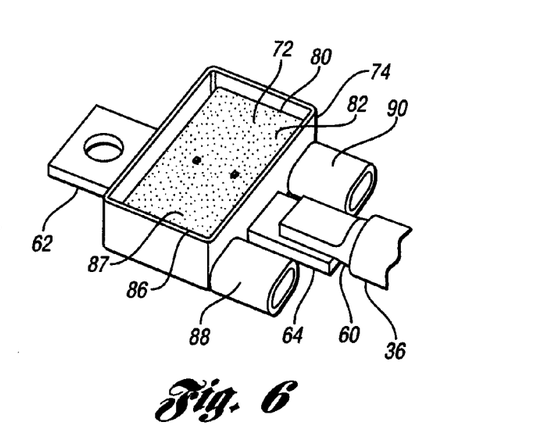

FIG. 5 illustrates a housing 74 that may be over-molded or otherwise attached to the shunt 40. The housing 74 may comprise a non-conducting material configured for supporting the PCB 72 relative to the shunt 40. The housing 74 may be attached to the shunt 40 through other operations besides over-molding, such as through hot melting. FIG. 6 illustrates insertion of the PCB 72 within the housing 74. The housing 74 may include a raised center portion 76 or columns 78 to facilitate offsetting the PCB 72 from the housing 74. Electrical connections 80-86 may be included to facilitate connecting the PCB 72 to a network interface port 88 and a temperature sensor port 90, which may be eliminated if an external temperature sensor is not used. The PCB 72 may be soldered to the various electrical connections, i.e., the shunt 40 and network interface/temperature sensor connections 82-86.

The PCB 72 may include a network interface (not shown) and related components to facilitate connecting to the network port 90 and interfacing signals with the VSC 30. The network interface may be used to interface any number of signals between the battery monitor 12 and the VSC 30. For example, one or two-way communications may be established with the battery monitor 12 to facilitate any number of operations, such as but not limited to operations associated with sensing and measuring current, voltage, temperature, and other operating parameters of the battery.

An external temperature sensor (see FIG. 2) 94 may be used to sense the battery temperature as a function of the terminal adapter temperature. A negative or positive temperature coefficient element may be included proximate the battery post 56 to facilitate sensing the temperature. A wire or multiple wires 96 may be encapsulated in a tube may be used to facilitate communicating signals from the temperature sensor back to the processing element. The temperature sensor 94 may include a ring terminal 98 for threadably fastening the temperature sensor to the terminal adapter 50 (the ring terminal 98 may also be directly welded to the terminal adapter 50). The ring terminal 98 and terminal adapter 50 may be composed of a rigid metallic material to promote thermal conductivity between the battery post and temperature sensor.

Figure 7:
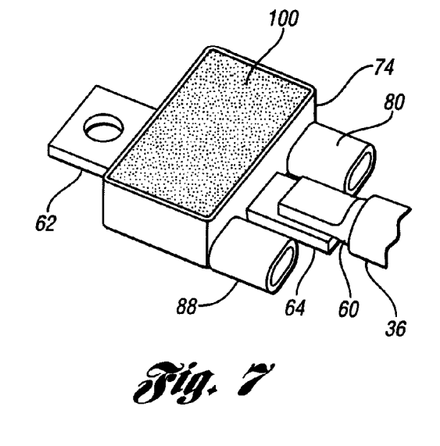
Figure 8:
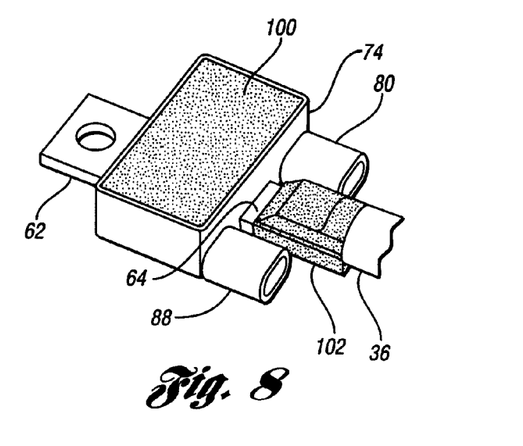

FIG. 7 illustrates a non-conducting resin 100 that may be filled in within the side walls of the housing 74 to vibrationally and electrically isolate and waterproof the PCB 72. The resin 100 may be beneficial in enhancing system integrity against contaminates, water, debris, etc. and/or to facilitate packaging and other component design. The resin 100 may comprise any suitable material and be used to encase the connector features in a waterproof mold. FIG. 8 illustrate a heat-shrink tube 102 that me attached around the electrically conducting portion of the cable to electrically isolate it.

Figure 9:
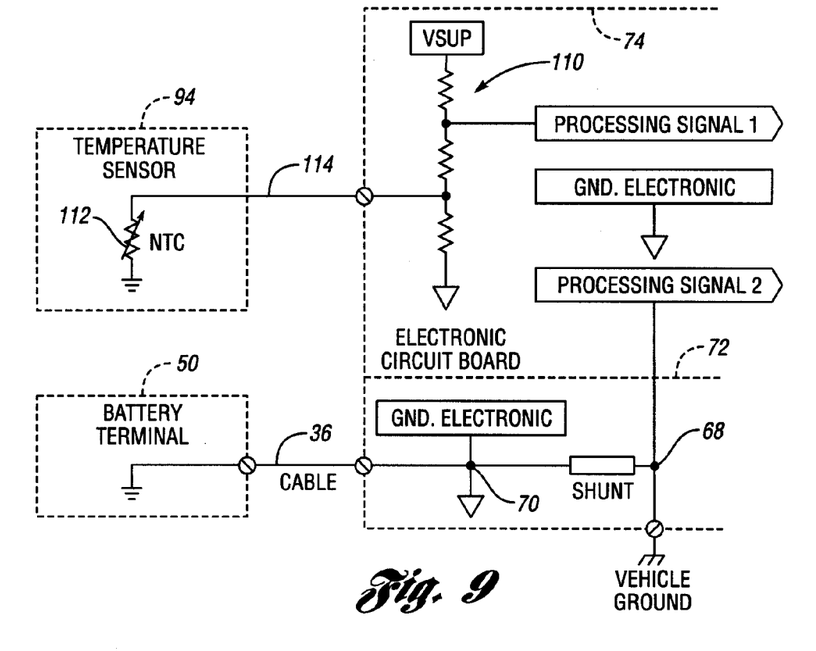
FIGS. 9-12 schematic illustrate operation of the battery monitor in accordance with one non-limiting aspect of the present invention.

FIG. 9 schematic illustrates operation of the battery monitor 12 in accordance with one non-limiting aspect of the present invention. This illustrates the housing 74, PCB 72 and its components (processing element, etc.) and various connection locations associated with monitoring temperature and battery current (voltage drop across the shunt). This example includes a common ground (GND electronic) between the elements of the PCB 72 and the vehicle chassis 24 due the PCB 72 sharing the same ground as the cable 36 connected to the battery post 56. Noise and other interface resulting from the electronic devices switching on/off or otherwise operating can influence the temperature and current monitoring performed by the processing element since processing element shares the same grounding cable connected to the negative battery pole as the vehicle chassis.

A voltage divider 110 may be included to facilitate delivering power to the temperature sensor 94 (Vsup). Power used to operate the PCB 72 may be provided by a wire (not shown) connecting to a positive battery post or other power source within the vehicle. The processing unit may determine current flow as a function of the voltage drop across the shunt 40 through the electrical connection of the pins 68-70, with one pin 70 being the common ground reference (GND electronic) and the other pin 68 providing a processor input (processing signal 2).

A NTC component 112 of the temperature sensor 94 may be grounded to the battery terminal 56. A single wire 114 may be run between the battery monitor 12 and the temperature sensor 94 to facilitate monitoring battery temperature. As the battery temperature changes, the voltage drop across the temperature sensor NTC 112 may vary and present a resulting voltage variation to the processing element (processing signal 1) for use in monitoring battery temperature.

Figure 10:
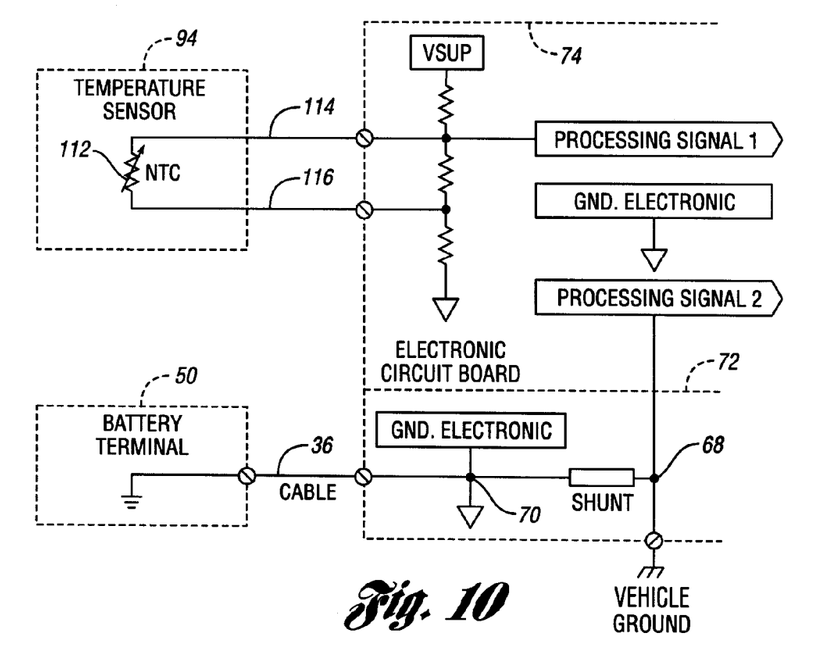

FIG. 10 illustrates a similar arrangement to that of FIG. 9 with a second wire 116 to communicate between the temperature sensor and processing element. In this arrangement, the NTC component 112 is connected to the same ground as the cable and PCB (GND electronic). This common ground can make it easier to sense the voltage drop than the arrangement shown in FIG. 9 since the voltage drop across the cable 36 need not to be considered due to the PCB sharing the same ground as the NTC component 112. The NTC component 112 in this arrangement may be different from the arrangement in FIG. 9 since it is not grounded to the battery post, i.e., it can be an 'off-the-shelf' component since these components are not typically grounded in the manner shown in FIG. 9.

Figure 11:
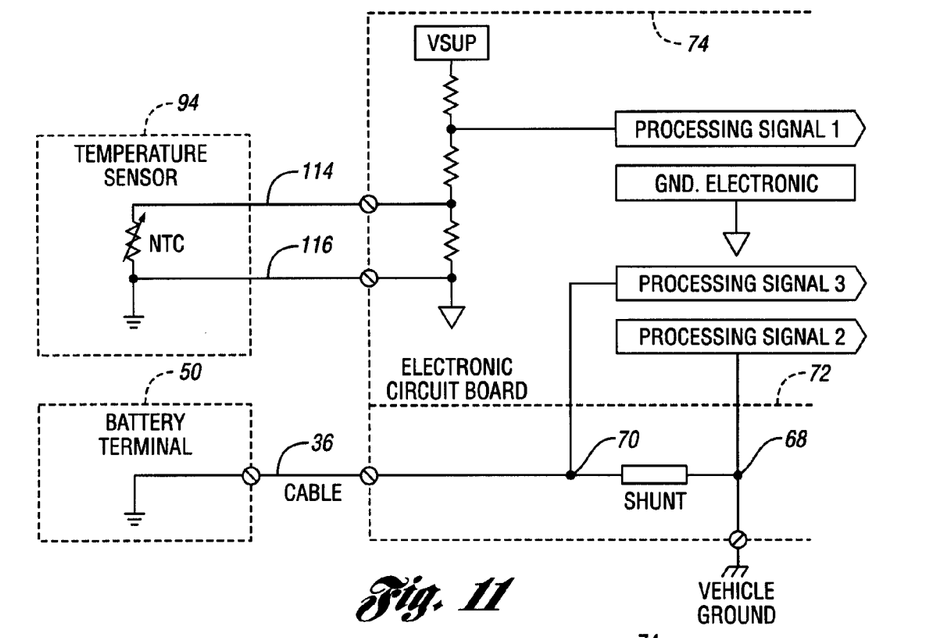

FIG. 11 schematically illustrates a more electrically separate arrangement than that shown in FIGS. 9 and 10 where the second wire 116 is used to connect the PCB ground (GND electronic) to the negative battery post 56 instead of to the cable 36 and vehicle chassis 24. The direct connection to the negative battery post 56 ground provides a 'cleaner' ground for the PCB 72 than the vehicle ground associated with the shunt-to-cable connection point as it helps to eliminate the noise associated with the vehicle ground connection to the negative battery post 56. This can be helpful in preventing noise and other interferences from disrupting battery monitoring performed by the processing element. In this arrangement, the pin 70 used to connect the PCB 72 to the vehicle ground associated with the shunt-to-cable connection point in FIGS. 9 and 10 now provides a signal to the processor (processing signal 3) to facilitate determining the voltage drop across the shunt 40.

Figure 12:
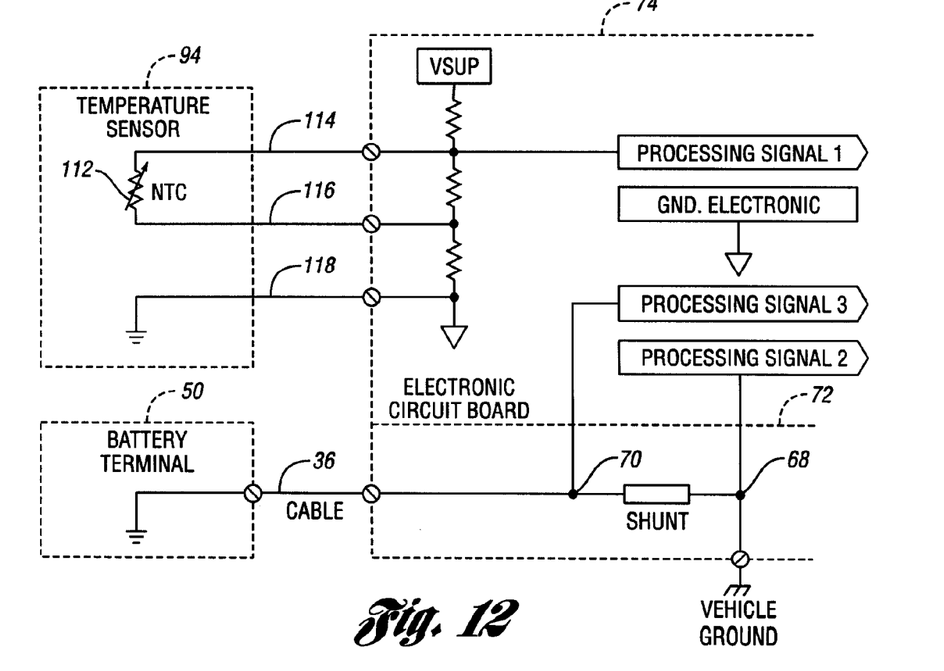

FIG. 12 schematically illustrates a similar arrangement to that of FIG. 10 with a third wire 118 used to facilitate grounding the PCB directly to the negative battery post. This arrangement takes advantage of the electrical separation provided in FIG. 11 with the use of the off-the-shelf NTC component provided in FIG. 10 with only the addition of the third wire 118.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A battery monitoring system for monitoring a battery used to power a number of electronic devices in a vehicle, the system comprising:
    a vehicle chassis providing a vehicle ground for grounding the electronic devices powered with the battery;
    a terminal adapter having one end compressively connected to a negative conducting post of the battery;
    a cable attached to an other end of the terminal adapter to electrically connect the terminal adapter to the vehicle chassis, the electrical connection connecting the battery and the electronic devices to the same vehicle ground;
    a battery monitor connected between the cable and the vehicle chassis at a distance along the cable extending beyond the battery, the battery monitor including a shunt and a processing element electrically connected to the shunt, the shunt connected at one end to the cable and at another end to the vehicle chassis for passing current from the cable to the vehicle chassis, the processing element calculating a voltage drop across the shunt for use in monitoring the battery; and
    a temperature sensor connected to the terminal adapter and having a wire for electrically connecting the temperature sensor to the processing element, the wire being independent of the cable and extending a distance D away from the battery, the battery monitor being positioned at a distance along the cable such that the cable is approximately as long as the distance D, the processing element calculating a battery temperature based on signals received from the temperature sensor.

2. The system of claim 1 wherein the temperature sensor includes a resistor, the processing element calculating the battery temperature from a voltage drop across the resistor, the voltage drop across the resistor varying with battery temperature and wherein the resistor is grounded to the battery post with a ring terminal affixed to the terminal adapter.

3. The system of claim 1 wherein the temperature sensor includes a resistor, the processing element calculating the battery temperature from a voltage drop across the resistor, the voltage drop across the resistor varying with battery temperature wherein the resistor is grounded to a printed circuit board (PCB) ground (GND electronics) of a PCB having the processing element.

4. The system of claim 3 wherein a PCB ground path is to the cable connected to the battery post, thereby causing the PCB ground to have a greater ground voltage than the PCB ground would have if connect directly to the negative conducting post of the battery.

5. The system of claim 3 further comprising a second wire for connecting the PCB directly to the negative conducting post of the battery so that a PCB grounding path is direct to the battery post and not through the cable.

6. The system of claim 5 further comprising a third wire for electrically grounding the temperature sensor to the processing element, wherein the first and third wires connect the processing element to the resistor and the second wire grounds the PCB to the battery post.

7. The system of claim 6 wherein each wire is attached to the cable to support the wires as the wires extend between the terminal adapter and the battery monitor.

8. The system of claim 1 wherein the battery monitor includes a network interface for communicating the battery temperature and the voltage drop to a vehicle system controller connected to a network bus of the vehicle and a temperature sensor interface for communicating with the temperature sensor.

9. The system of claim 1 wherein the battery monitor includes two connecting pins spaced apart along the shunt to electrically connect the shunt to the processing element, the processing element calculating the voltage drop between the connecting pins.

10. The system of claim 1 wherein the terminal adapter is L-shaped and configured to have one leg of the L-shape extending down a lateral, exterior side of the battery leading downwardly from a top of the battery coplanar with the negative conducting post, the one leg extending down the side where at the one leg is connected to the cable.

11. The system of claim 1 wherein the shunt is one of a planar shunt composed of a bi-metallic material, the cable and vehicle chassis being fastened directly to the shunt, and a cylindrical shunt is composed on a bi-metallic material, the cable and vehicle chassis being fastened directly to the shunt, wherein the cable is longer than an entire exterior width of the battery.

12. The system of claim 1 wherein the temperature sensor is external to the battery monitor and directly connected to the negative conducting post of the battery, the distance D being at least twice as long as an entire length of the battery monitor.

13. A battery monitoring system for monitoring a battery used to power a number of electronic devices in a vehicle, the system comprising:
- a terminal adapter having one end compressively connected to a negative conducting post of the battery;
- a flexible cable attached to an other end of the terminal adapter and extending a first distance away from the battery, the first distance being sufficient for the cable to extend beyond a perimeter of the battery;
- a battery monitor including a processing element electrically connected to a shunt, the shunt connected at one end to the cable and at another end to a vehicle chassis for passing current from the cable to the vehicle chassis, the vehicle chassis defining a vehicle ground, the processing element calculating a voltage drop across the shunt for use in monitoring the battery;
- a wire extending from the processing element to the negative pole of the battery, the wire establishing a processing element ground sufficient to facilitate separating the processing element from noise associated with the vehicle ground, the wire being at least approximately as long as the first distance; and
- a temperature sensor connected to the terminal adapter and electrically connected to the processing element, the battery monitor being positioned at a distance D along the flexible cable away from the battery such that the flexible cable is approximately as long as the distance D, the processing element calculating a battery temperature based on signals received from the temperature sensor.

14. The system of claim 13, wherein the temperature sensor comprises a resistor configured to change resistance in proportion to a temperature of the battery, the temperature sensor being connected to the processing element ground to facilitate separating the processing element from noise associated with the vehicle ground.

15. The system of claim 14 wherein the resistor is grounded directly to the battery post.

16. The system of claim 14 wherein an additional wire is included to ground the resistor to the processing element ground, the additional wire being at least as long as the first distance, the first distance being longer than an entire length of the battery monitor.

17. The system of claim 13 wherein the first distance is greater than an entire exterior width of the battery and the temperature sensor is external to the battery monitor and connected directly to the negative conducting post of the battery.

18. A battery monitoring system comprising:
- a non-flexible shunt having a first end and a second end, the first end operably connected to a flexible cable leading a first length away to a battery post and the second end operably connected to a vehicle chassis;
- a processing element operable to calculate a voltage drop across the shunt for use in outputting signaling used in battery monitoring;
- wherein the processing element is grounded to the battery post, and not the vehicle chassis, with a wire approximately equal in length to the first length, a majority of the wire running exterior to the flexible cable and to a housing enclosing the processing element and the shunt; and
- a temperature sensor electrically connected to the processing element, the processing element being positioned at a distance D along the flexible cable away from the battery post such that the flexible cable is approximately as long as the distance D, the processing element calculating a battery temperature based on signals received from the temperature sensor.

19. The battery monitoring system of claim 18 wherein the wire is smaller in diameter than the flexible cable.

* * * * *

UNITED STATES PATENT AND TRADEMARK OFFICE
CERTIFICATE OF CORRECTION

PATENT NO.        : 8,476,864 B2
APPLICATION NO.   : 11/762424
DATED             : July 2, 2013
INVENTOR(S)       : Antoni Ferre Fabregas Page 1 of 1

It is certified that error appears in the above-identified patent and that said Letters Patent is hereby corrected as shown below:

In the Claims

Column 6, Line 26, Claim 4:

After "would have if" delete "connect" and
Insert -- connected --.

Signed and Sealed this
Eighteenth Day of March, 2014

Michelle K. Lee
*Deputy Director of the United States Patent and Trademark Office*